US012652971B2

(12) United States Patent
Roy et al.

(10) Patent No.: US 12,652,971 B2
(45) Date of Patent: Jun. 9, 2026

(54) PIEZORESISTIVE TRANSISTOR DEVICE AND POWER ELECTRONIC MODULE INCLUDING A PIEZORESISTIVE TRANSISTOR DEVICE

(71) Applicant: Infineon Technologies AG, Neubiberg (DE)

(72) Inventors: Saurabh Roy, Villach (AT); Josef Anton Moser, Sattendorf (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 473 days.

(21) Appl. No.: 18/454,852

(22) Filed: Aug. 24, 2023

(65) Prior Publication Data

US 2024/0090355 A1 Mar. 14, 2024

(30) Foreign Application Priority Data

Sep. 13, 2022 (DE) .......................... 102022123366.9

(51) Int. Cl.
H10N 99/00 (2023.01)
(52) U.S. Cl.
CPC .................................. H10N 99/03 (2023.02)
(58) Field of Classification Search
CPC .................................................. H10N 99/03
See application file for complete search history.

(56) References Cited

U.S. PATENT DOCUMENTS 5,872,372 A * 2/1999 Lee ......................... H10D 48/50
257/415
9,425,381 B2 8/2016 Elmegreen et al.
(Continued)

OTHER PUBLICATIONS

Newns, Dennis, et al., "A low-voltage high-speed electronic switch based on piezoelectric transduction", Journal of Applied Physics, vol. 111 (8): 084509. https://doi.org/10.1063/1.4704391, Apr. 15, 2012 pp. 084509-1-084509-18.
(Continued)

*Primary Examiner* — Benjamin P Sandvik
(74) *Attorney, Agent, or Firm* — Murphy, Bilak & Homiller, PLLC

(57) ABSTRACT
A piezoresistive transistor device includes a first transistor cell having a first piezoelectric material body and a first piezoresistive material body arranged in a stacked configuration. A first electrical resistance of the first piezoresistive material body is dependent upon a voltage applied across the first piezoelectric material body by way of a pressure applied by the first piezoelectric material body to the first piezoresistive material body. A second transistor cell includes a second piezoelectric material body and a second piezoresistive material body arranged in a stacked configuration. A second electrical resistance of the second piezoresistive material body is dependent upon a voltage applied across the second piezoelectric material body by way of a pressure applied by the second piezoelectric material body to the second piezoresistive material body. An internal electrical interconnect is configured to electrically connect the first electrical resistance and the second electrical resistance in series or in parallel.

31 Claims, 6 Drawing Sheets

(56) References Cited

U.S. PATENT DOCUMENTS

| | | | | |
|---|---|---|---|---|
| 9,679,645 | B2 * | 6/2017 | Elmegreen | G11C 13/0069 |
| 2010/0328984 | A1 * | 12/2010 | Elmegreen | G11C 11/412 |
| | | | | 29/25.35 |
| 2014/0169078 | A1 * | 6/2014 | Elmegreen | G11C 13/0002 |
| | | | | 257/254 |
| 2016/0064641 | A1 * | 3/2016 | Elmegreen | H10N 30/50 |
| | | | | 257/415 |
| 2017/0005265 | A1 * | 1/2017 | Sugahara | G11C 14/0081 |

OTHER PUBLICATIONS

Newns, Dennis M., et al., "High Response Piezoelectric and Piezoresistive Materials for Fast, Low Voltage Switching: Simulation and Theory of Transduction Physics at the Nanometer-Scale", Advanced Materials, Materials Views, vol. 24, 2012, pp. 3672-3677.

* cited by examiner

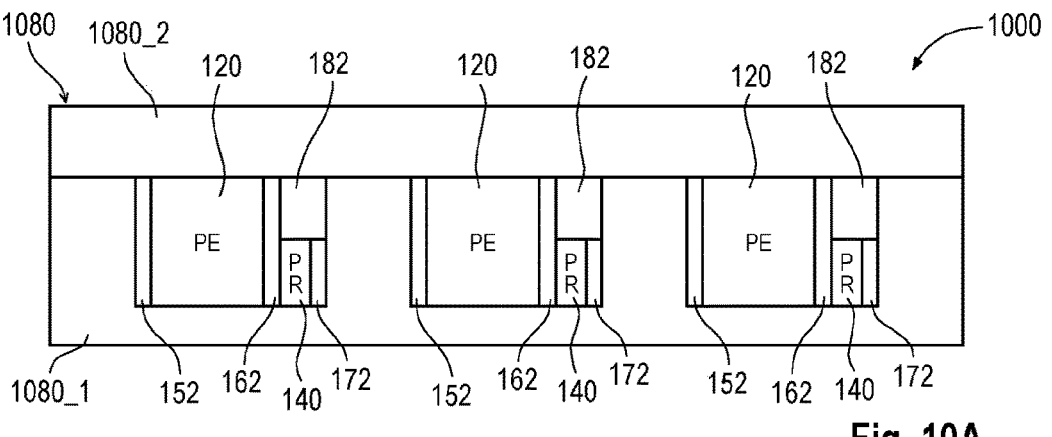
Fig. 10A
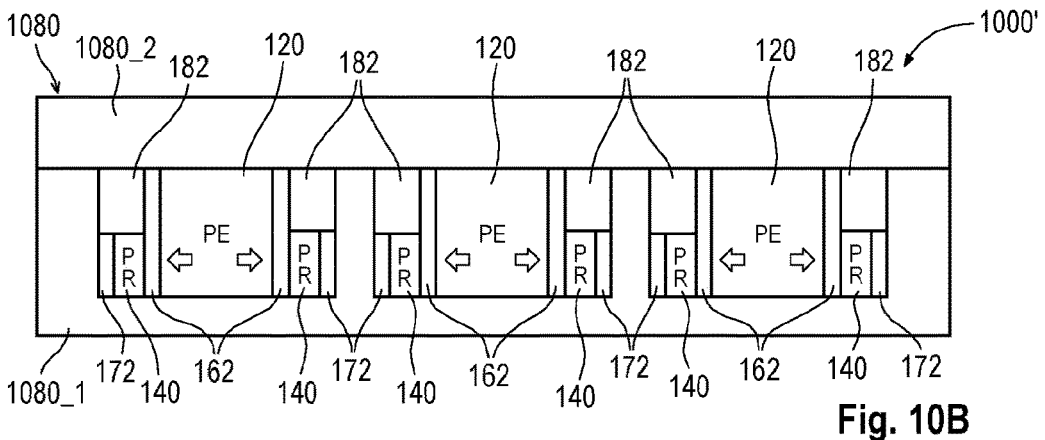
Fig. 10B
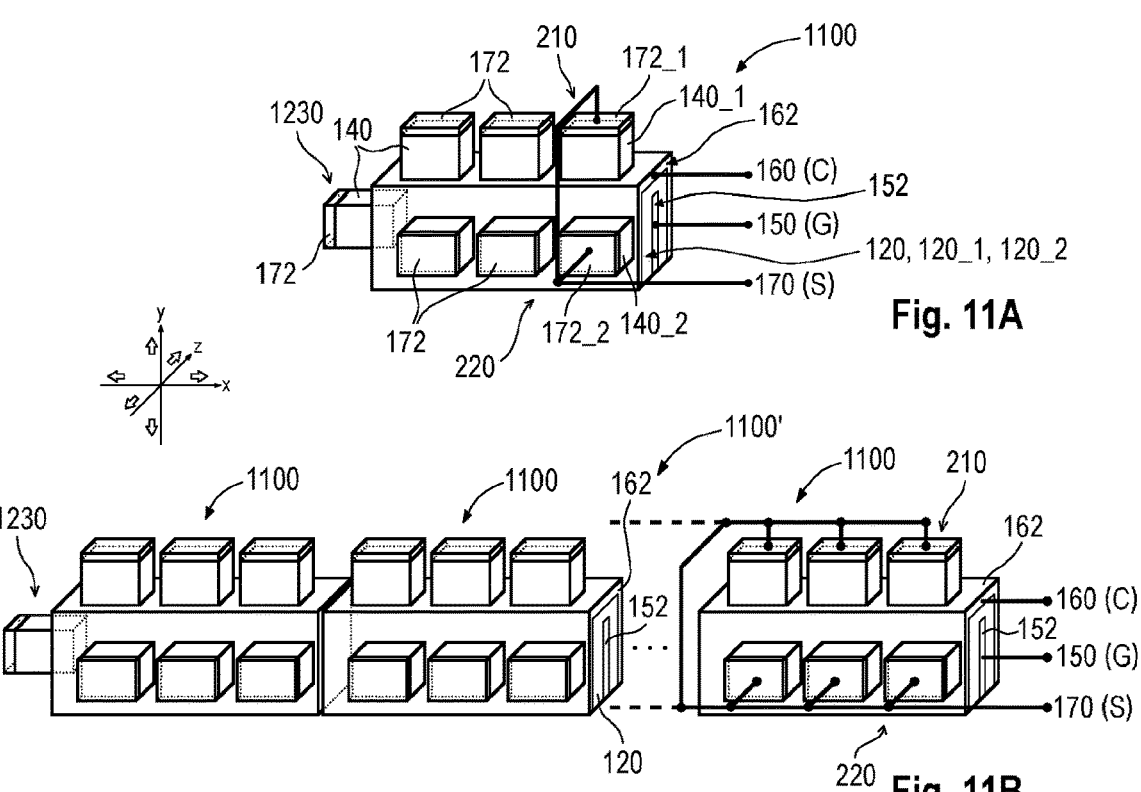
Fig. 11A
Fig. 11B

PIEZORESISTIVE TRANSISTOR DEVICE AND POWER ELECTRONIC MODULE INCLUDING A PIEZORESISTIVE TRANSISTOR DEVICE

TECHNICAL FIELD

This disclosure relates generally to the field of transistor devices, and in particular to piezoresistive transistor devices.

BACKGROUND

The most common transistor type is the MOSFET (metal oxide semiconductor field-effect transistor). MOSFETs take advantage of the peculiar properties of semiconductor materials to allow small electrical voltage signals to control the switching of sometimes much larger current signals. Over the years, MOSFETs have achieved enormous increase in power densities, breakdown robustness and reliability, yet facing constant challenges towards minimizing losses, failure rates, power densities, and better thermal and dynamic performances.

A conventional path for achieving these performance measures is miniaturization. Although such MOSFET devices enjoy excellent adaptation features to be tailored for different application areas, such advances in design go hand in hand with developments in other areas like efficiency and cost.

Field-effect transistors are controlled by independent carrier particles (electrons or holes) thermally surmounting a potential barrier, their carrier statistics explained by Boltzmann statistics. In contrast, a Mott transistor exploits an insulator to metal (Mott) transition in the channel. A Mott transistor can operate at low gate voltage due to the ability to induce the Mott transition with a small change in gate voltage. More specifically, the gate voltage in a Mott transistor is transduced to an internal state (pressure) which is gated and then transduced back to a voltage at the output. This working principle does not require thermionic emission of charge carriers over a barrier (as is the principle in MOSFETs) and therefore bypasses the fundamental limitations and challenges faced by MOSFETs. However, existing Mott transistors are limited to low voltage switching.

SUMMARY

According to an aspect of the disclosure, a piezoresistive transistor device comprises a first transistor cell. The first transistor cell comprises a first piezoelectric material body and a first piezoresistive material body. The first piezoelectric material body and the first piezoresistive material body are arranged in a stacked configuration, and a first electrical resistance of the first piezoresistive material body is dependent upon a voltage applied across the first piezoelectric material body by way of a pressure applied by the first piezoelectric material body to the first piezoresistive material body. The piezoresistive transistor device comprises a second transistor cell. The second transistor cell comprises a second piezoelectric material body and a second piezoresistive material body. The second piezoelectric material body and the second piezoresistive material body are arranged in a stacked configuration, and a second electrical resistance of the second piezoresistive material body is dependent upon a voltage applied across the second piezoelectric material body by way of a pressure applied by the second piezoelectric material body to the second piezoresistive material body. The piezoresistive transistor device comprises a control terminal, a first load terminal, a second load terminal and an internal electrical interconnect configured to electrically connect the first electrical resistance and the second electrical resistance in series or in parallel.

According to another aspect of the disclosure, a piezoresistive transistor device comprises a first plurality of transistor cells and a second plurality of transistor cells. Each transistor cell comprises a piezoelectric material body, and a piezoresistive material body, wherein the piezoelectric material body and the piezoresistive material body are arranged in a stacked configuration and an electrical resistance of the piezoresistive material body is dependent upon a voltage applied across the piezoelectric material body by way of a pressure applied by the piezoelectric material body to the piezoresistive material body. The piezoresistive transistor device further comprises a control terminal, a first load terminal, a second load terminal and an internal electrical interconnect configured to electrically connect the electrical resistances of the first plurality of transistor cells in series, to electrically connect the electrical resistances of the second plurality of transistor cells in series, and to electrically connect these two series connections in parallel.

According to another aspect of the disclosure, a power electronic module comprises a piezoresistive transistor device as recited above and a carrier on which the piezoresistive transistor device is mounted. The power electronic module further comprises a heatsink attached to the carrier.

According to another aspect of the disclosure, a piezoresistive transistor device comprises a first transistor cell. The first transistor cell comprises a piezoelectric material body and a first piezoresistive material body. The piezoelectric material body and the first piezoresistive material body are arranged in a stacked configuration. A first electrical resistance of the first piezoresistive material body is dependent upon a voltage applied across the piezoelectric material body by way of a pressure applied by the piezoelectric material body to the first piezoresistive material body. The piezoresistive transistor device further comprises a second transistor cell. The second transistor cell comprises the piezoelectric material body and a second piezoresistive material body. The piezoelectric material body and the second piezoresistive material body are arranged in a stacked configuration. A second electrical resistance of the second piezoresistive material body is dependent upon the voltage applied across the piezoelectric material body by way of a pressure applied by the piezoelectric material body to the second piezoresistive material body. The first piezoresistive material body and the second piezoresistive material body are oriented in different spatial planes which are not parallel to each other.

BRIEF DESCRIPTION OF THE DRAWINGS

In the drawings, like reference numerals designate corresponding similar parts. The features of the various illustrated embodiments can be combined unless they exclude each other and/or can be selectively omitted if not described to be necessarily required. Embodiments are depicted in the drawings and are exemplarily detailed in the description which follows.

FIG. 10A is a side view or sectional view of a housing structure having cavities for receiving transistor cells, the cavities being disposed adjacent to each other with respect to a lateral dimension of the housing structure.

FIG. 10B is a side view or sectional view of a further housing structure having cavities for receiving transistor cells, the cavities being disposed adjacent to each other with respect to a lateral dimension of the housing structure.

FIG. 11A is a perspective view on an exemplary piezoresistive transistor device having a layer or body stack in which a first transistor cell and a second transistor cell are oriented in different spatial directions.

FIG. 11B illustrates a device including a plurality of layer or body stacks as shown in FIG. 11A.

DETAILED DESCRIPTION

It is to be understood that the features of the various exemplary embodiments and examples described herein may be combined with each other unless specifically noted otherwise.

As used in this specification, the terms "electrically connected" or "connected" or similar terms are not meant to mean that the elements are directly contacted together; intervening elements may be provided between the "electrically connected" or "connected" elements, respectively.

However, in accordance with the disclosure, the above-mentioned and similar terms may, optionally, also have the specific meaning that the elements are directly contacted together, i.e. that no intervening elements are provided between the "electrically connected" or "connected" elements, respectively.

Further, the words "over" or "beneath" with regard to a part, element, material layer or material body formed or located or arranged "over" or "beneath" a surface may be used herein to mean that the part, element, material layer or material body be located (e.g. placed, formed, arranged, deposited, etc.) "directly on" or "directly under", e.g. in direct contact with, the implied surface. The word "over" or "beneath" used with regard to a part, element, material layer or material body formed or located or arranged "over" or "beneath" a surface may, however, either be used herein to mean that the part, element, material layer or material body be located (e.g. placed, formed, arranged, deposited, etc.) "indirectly on" or "indirectly under" the implied surface, with one or more additional parts, elements, material layer or material body being arranged between the implied surface and the part, element, material layer or material body.

Figure 1A:
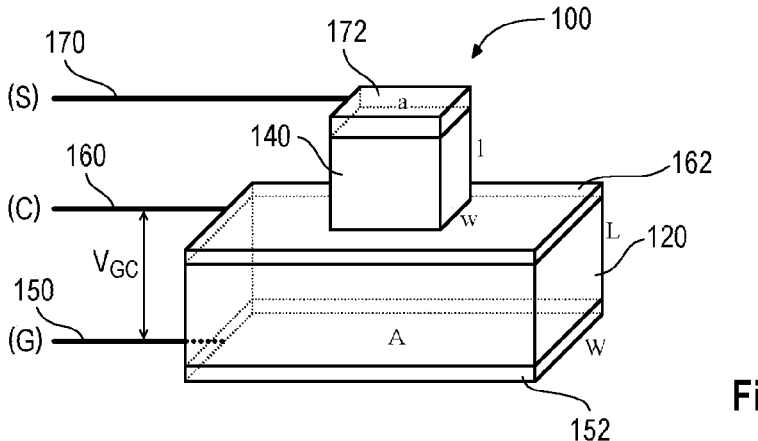
FIG. 1A is a perspective view on an exemplary piezoresistive transistor device having a layer or body stack including a piezoelectric material body and a piezoresistive material body.
Figure 1B:
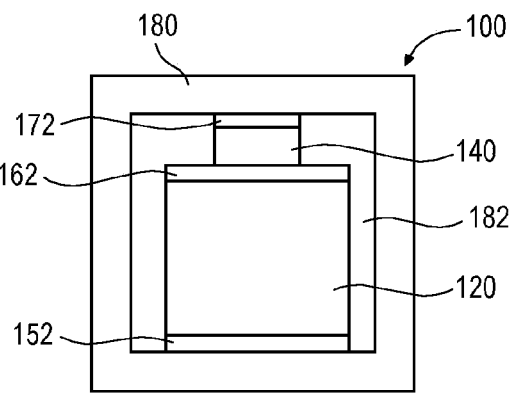
FIG. 1B is a side view of an exemplary piezoresistive transistor device including a layer or body stack arranged, e.g., as shown in FIG. 1A.

FIGS. 1A and 1B illustrate an example of a Mott Field-Effect-Transistor (MottFET) device 100. The MottFET device 100 includes a transistor cell which has a piezoelectric (PE) material body 120 (which may, e.g., have the shape of a layer or a bar or a cube) and a piezoresistive (PR) material body 140 (which may, e.g., have the shape of a layer). The PE material body 120 and the PR material body 140 are arranged in a stacked configuration.

The MottFET device 100 includes a control terminal 150, which is referred to as a gate (G) terminal, a first load terminal 160, which is referred to as a common (C) terminal, and a second load terminal 170, which is referred to as a source (S) terminal.

Further, the MottFET device 100 may include a control metal layer 152, a first metal layer 162 and a second metal layer 172. The control metal layer 152 may be arranged at the bottom of PE material body 120 and may be electrically coupled to the control terminal 150. The first metal layer 162 may be arranged between the PE material body 120 and the PR material body 140, and may be electrically coupled to the first load terminal 160. The second metal layer 172 may be arranged at the top of the PR material body 140 and may be electrically coupled to the second load terminal 170. The control metal layer 152, the first metal layer 162 and the second metal layer 172 form a control electrode, a first load electrode and a second load electrode of the MottFET device 100, respectively. The control electrode does not have to be in the form of a layer, but can comprise a control metal element with other shapes, such as a rod or bar shape (see FIGS. 11A, 11B, 14).

For example, the MottFET device 100 may be a five layer stack device consisting of the control metal layer (or element) 152, the PE material body (or layer) 120, the first metal layer 162, the PR material body (or layer) 140 and the second metal layer 172.

The MottFET device 100 may include a housing structure 180 forming a cavity 182 for receiving the transistor cell. The housing structure 180 may be formed of a robust material, e.g. a high strength material (HSM). The surrounding HSM may provide a strong support against which the PE material body 120 can apply pressure to the PR material body 140. In other words, the PE material body 120 and the PR material body 140 are clamped together by a mechanical cage formed by the housing structure 180.

The cavity 182 may accommodate a void (e.g., left after a sacrificial material is removed by etching) in the HSM for allowing free lateral displacement of the PE material body 120 and the PR material body 140.

In operation, an input voltage applied between the control terminal 150 (G) and the first load terminal 160 (C), e.g. across the PE material body 120, causes the PE material body 120 to expand against the PR material body 140. This transduces the input voltage into an internal mechanical-pressure signal (internal transduction). The PE material body 120, acting as a capacitor dielectric, impedes any significant leakage current. The PR material body 140, in contrast, undergoes a pressure-induced continuous Mott transition, changing resistance by several orders of magnitude, thereby creating a low-impedance path between the second load terminal 170 (S) and the first load terminal 160 (C), and transducing the pressure signal back to voltage.

A (large) area ratio between the PE material body 120 and the PR material body 140 serves to transform a small stress in the PE material body 120 into a high stress in the PR material body 140 such that only a small input (or drive) voltage is needed to swing the S-to-C impedance (the impedance of the PR material body 140) from high to low (internal potential step-up). Reasonable strain and electrical fields in the PE material body 120 are achieved by ensuring the PE material body 120 to PR material body 140 ratio is high.

In other words, the input voltage $V_{GC}$ actuates the piezoelectric effect. The piezoelectric effect is transduced across the piezoresistive material body 140. The piezoresistive effect causes the Mott transition on which the electrical switching of the MottFET device 100 relies.

Differently put, the piezoelectric response of the actuator, which includes the PE material body 120, translates the input voltage $V_{GC}$ to a mechanical pressure which modulates the electrical resistance of the PR material body 140, e.g. the output piezoresistivity. In the OFF-state of the MottFET device 100, the PR material body 140 is in a high-resistance state, thereby blocking the output current, while in the ON-state of the MottFET device 100, the voltage $V_{GC}$ causes the PE material body 120 to expand in a direction normal to the plane of the layer, thereby applying pressure to the PR material body 140. This actuation results in a drop in the electrical resistance of the PR material body 140, thus allowing the output current to flow between the first metal layer 162 and the second metal layer 172, and hence between the first load terminal 160 (C) and the second load terminal 170 (S).

The device concept utilizes the Mott transition of the PR material. In its insulating state, the electrons are bound to, e.g., their transition metal atoms, their electron-electron Coulomb repulsion is large and their interatomic hopping energy is low. Even if a voltage $V_{GC}$ is applied across such a material, the Coulomb barrier is insurmountable by the hopping kinetic energy. Upon application of pressure, the crystal structure of such a material deforms which leads to an abundance of empty sites available for the electrons to move about, thereby causing a disappearance of the energy gap.

In a model for the MottFET operation, the resistivity of PR materials is typically found to be approximately exponential in pressure over a wide range, and hence the pressure dependence could be modelled by $$\rho = \rho_0 \exp[-Q\rho] \quad Q = -d \ln \rho / dp. \tag{1}$$

Q denotes the material constant defined in terms of pressure (p), and $\rho_0$ is the PR material resistivity at zero pressure (p=0). The dependence of pressure on voltage $V_{GC}$ is based on the assumptions of linear response of the PE to applied field, and the applicability of linear elasticity theory to the transistor cell. A relatively simple approximation, which considers only the $d_{33}$ components of stress (out-of-plane), strain, and piezoelectric response yields:

$$p \cong \frac{d_{33} V_{GC}}{\dfrac{l}{Y_{PR}} + \dfrac{d}{Y_{PE}}} \tag{2}$$

with $d = La/A$.

Here, $d_{33}$ is the piezoelectric response coefficient, $Y_{PR}$ and $Y_{PE}$ are the Young's moduli of the PR and PE material, respectively, l is the PR material body thickness, d is the PE material body thickness L scaled by the reciprocal of the step-up factor A/a (see FIG. 1A). With the help of the above two relations, the linear electrical common-source resistance $R_{SC}$ of the PR material body 140 in terms of $V_{GC}$ could be written as $$R_{SC} = R_0 \exp\left(-\frac{V_{GC}}{V_\theta}\right) \tag{3}$$

with $V_\theta = \left(\dfrac{l}{Y_{PR}} + \dfrac{d}{Y_{PE}}\right) / (Q d_{33})$ $R_0 = \rho_0 l / a$.

In this equation, the threshold voltage is $V_0$ and the OFF state resistance is $R_0$. Consequently, the current flowing through the PR material body 140 (i.e. the common-source current) $I_{SC}$ is given by:

$$I_{SC} = V_{SC} / R_{SC} = V_{SC} R_0^{-1} \exp\left(\frac{V_{GC}}{V_\theta}\right). \tag{4}$$

It is desired to provide for a MottFET device 100 which has power switching capability, i.e. is suited for switching higher voltages and/or higher currents than conventional Mott transistors. Power switching capability can be achieved by appropriately tailoring the device dimensions and/or by appropriate material selection of the PE and, in particular, PR material(s) and/or by appropriate implementation of an internal interconnect of the MottFET device 100.

With the given values of the PE and PR materials, the device dimensions were tailored to obtain a threshold voltage of about 1.2 V. High values of $R_{OFF}/R_{ON}$ were observed. In particular, the maximization of the $R_{OFF}/R_{ON}$-ratio is an important criterion for high power devices, e.g. high-power devices with a high vertical current flow and a thick PR material body providing the blocking capability. In contrast to low voltage devices the PR material body 140 may have a voltage blocking capability between 25 V and 7 kV and may carry currents ranging between several A and more than 50 A (locally with much higher current densities during surge current conditions, short-circuit events and over-current turn-off).

Another criterion for power devices is the required ruggedness against cosmic radiation events. The targeted material selection and dimensions (layer thickness, area etc.) may be optimized in respect to these special high-power applications. Typically, the thickness of the PR material body 140 is more than a factor 5 higher compared to conventional low voltage switching Mott transistors. The lateral extensions of the PR material body 140 may even be more than one order of magnitude higher than for conventional low voltage switching Mott transistors.

The following example values of quantities may, e.g., be chosen:

Thickness of PR material body 140: 1=40 nm
Area of surface of PR material body 140: a=10,000 nm$^2$
Thickness of PE material body 120: L=500 nm
Area of surface of PE material body 120: A=50,000 nm$^2$
D=L*a/A=500
For example, typical values are
$d_{33}$=1.4 nm/V
B=5.4 GPa$^{-1}$
$Y_{PE}$=60 GPa
$Y_{PR}$=40 GPa
$\rho_0$=0.2 Ωm Threshold voltage=1.2 to 30 V for power applications. Accordingly, e.g. for $V_{GC}$=25 V, $R_{SC}$=1.79 $10^{-10}$Ω, see equation (3).

All dimensions of the device components may, e.g., be chosen within a ±50% range, in particular a ±30% or, more particularly, a ±15% range of the above example values.

With typical values of one such PE and PR material combination and choosing the dimensions of the device components, the threshold voltage and $R_{ON}$/$R_{OFF}$ ratio can be calculated.

PE materials may, e.g., include or be AlN, BaTiO3, LiNbO3, PMN-PT, PZT, AlScN, PVDF, and/or AlScN.

PR materials may, e.g., include or be SmSe, SmS, $V_xO_y$, (e.g. VO$_2$, V$_2$O$_3$, V$_2$O$_5$), TmTe, (Sm$_{1-x}$Eu$_x$) S, (V$_{1-x}$Cr$_x$)$_2$O$_3$, and/or SiC nanowires. These materials may, e.g., be appropriately doped with impurity atoms.

In at least some of these PR materials the Mott transition relies on the pressure sensitivity of the energy gap between the 4f and 5d bands. Under strain, the energy gap narrows continuously enabling thermal promotion of the localized 4f states to the conduction band. Increase in populating the 5d band provides exponential increase in conductivity (i.e. reduction in electrical resistance) of the PR material body 140.

An input voltage pulse $V_{GC}$ activates the PE material body 120, which transduces the input voltage $V_{GC}$ into a pressure pulse. The pressure pulse, in turn, drives the Mott transition in the PR material body 140. Using the known properties of bulk materials, it can be shown that the MottFET device 100 in accordance with the disclosure can achieve multi-GHz clock speeds and a large ON/OFF switching ratio (e.g. ~$10^6$-$10^7$) for power switches.

Figure 2:
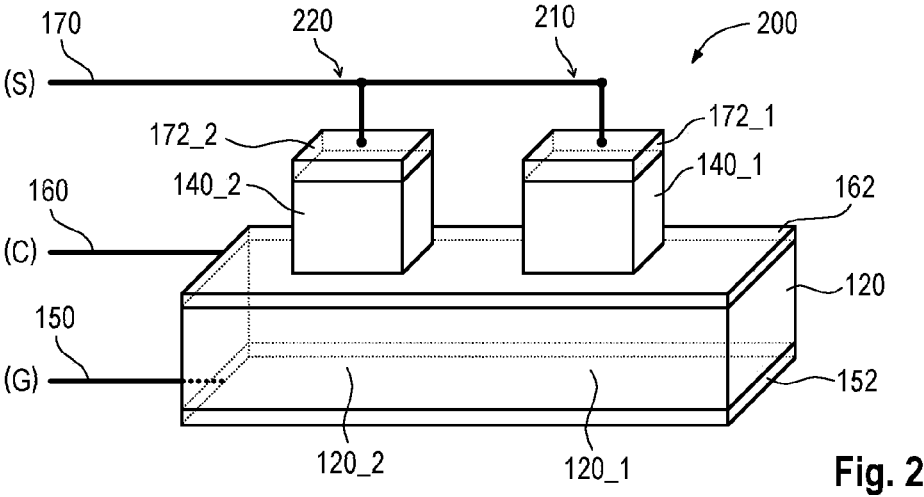
FIG. 2 is a perspective view on an internally parallel-connected exemplary piezoresistive transistor device having a layer or body stack including a piezoelectric material body and first and second piezoresistive material bodies.

FIG. 2 illustrates a layer stack of a MottFET device 200 which includes at least two transistor cells 210, 220. A first transistor cell 210 includes a first PE material body 120_1 and a first PR material body 140_1. The first PE material body 120_1 and the first PR material body 140_1 are arranged in a stacked configuration.

Further, the MottFET device 200 includes a second transistor cell 220. The second transistor cell 220 includes a second PE material body 120_2 and a second PR material body 140_2. The second PE material body 120_2 and the second PR material body 140_2 are arranged in a stacked configuration.

In the example of FIG. 2, the first PE material body 120_1 and the second PE material body 120_2 are formed by a common, continuous PE material body 120. Differently stated, the PE material body 120 is only imaginarily partitioned into a first and a second PE material body 120_1, 120_2. That is, the two transistor cells 210, 220 share a common PE material body 120 also referred to as a "PE bus bar".

The first and second PE material bodies 120_1, 120_2 as well as the PE material body 120 may, e.g., have the shape of a structured layer. However, it is also possible that first and second PE material bodies 120_1, 120_2 and the PE material body 120 have the shape of a bar or a block or a cube or a cylinder (see, e.g., FIGS. 11A, 11B, 14).

The electrical resistance of the first PR material body 140_1 is dependent upon the voltage $V_{GC}$ applied across the first PE material body 120_1 by way of a pressure applied by the first PE material body 120_1 to the first PR material body 140_1. Analogously, the electrical resistance of the second PR material body 140_2 is dependent upon the voltage $V_{GC}$ applied across the second PE material body 120_2 by way of a pressure applied by the second PE material body 120_2 to the second PR material body 140_2. To this end, the first and second transistor cells 210, 220 may each be clamped, as described above, by means of a housing structure 180 (not shown in FIG. 2). The housing structure 180 may, e.g., have a common cavity receiving the first transistor cell 210 and the second transistor cell 220 or may, alternatively, be provided with separate cavities each receiving only one (or, more generally, if more than two transistor cells are provided, a subset) of the transistor cells 210, 220.

The MottFET device 200 further includes an internal electrical interconnect which is configured to electrically connect the electrical resistance of the first PR material body 140_1 and the electrical resistance of the second PR material body 140_2 in parallel. To this end, the electrical interconnect may connect the common control metal layer 152 to the control terminal (G) 150, the (e.g. common) first metal layer 162 to the first load terminal (C) 160 and the second metal layers 172_1, 172_2 of the first and second transistor cells 210, 220 to the second load terminal (S) 170.

As will be described in more detail further below (e.g., FIGS. 4 and 5), more than two transistor cells 210, 220 may be used.

Figure 3A:
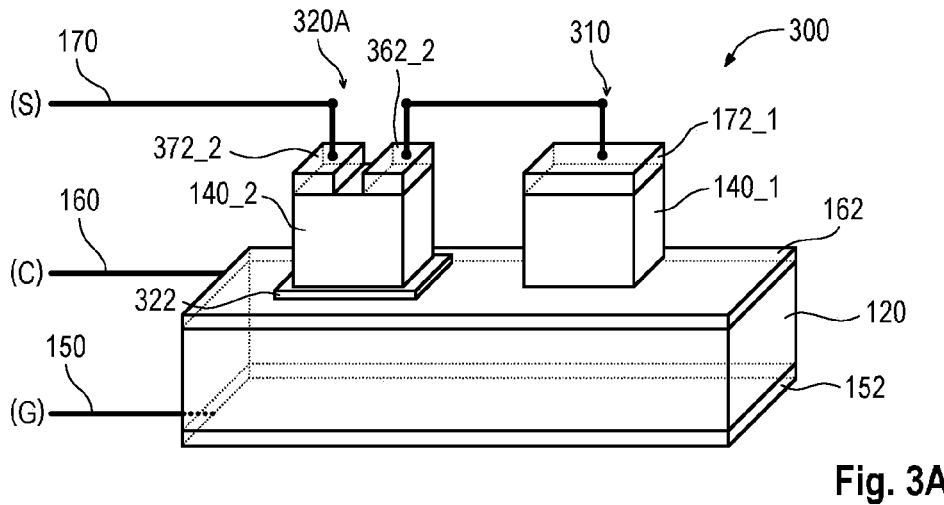
FIG. 3A is a perspective view on an internally series-connected piezoresistive transistor device according to a first series connection approach.
Figure 3B:
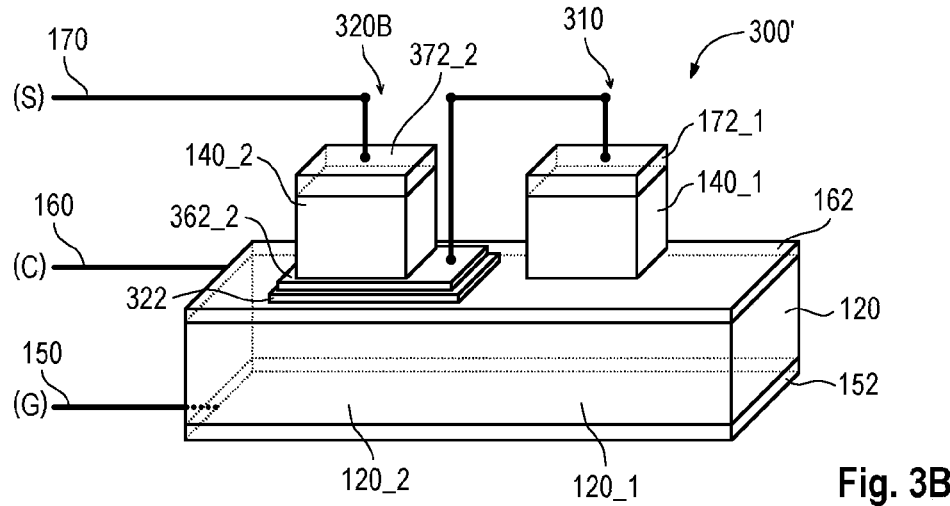
FIG. 3B is a perspective view on an internally series-connected piezoresistive transistor device according to a second series connection approach.

FIGS. 3A and 3B illustrate an exemplary layer stack of a MottFET device 300 including a first transistor cell 310 and a second transistor cell 320A. Similar as already described in conjunction with the MottFET device 200, the MottFET device 300 optionally uses a common PE material body 120 which is, for example, imaginarily partitioned in the first PE material body 120_1 and the second PE material body 120_2.

The first transistor cell 310 may be identical with the first transistor cell 210 of the MottFET device 200, and reference is made to the above description in order to avoid reiteration.

The second transistor cell 320A may include an insulating layer 322. The insulating layer 322 electrically insulates the bottom of the second PR material body 140_2 from the (optionally common) first metal layer 162.

A first load electrode 362_2 of the second transistor cell 320A may be implemented by a metal layer which covers, e.g., a part of the top surface of the second PR material body 140_2. The first load electrode 362_2 of the second transistor cell 320A may be electrically connected to the second metal layer 172_1 (i.e. the second load electrode) of the first transistor cell 310.

Further, the second transistor cell 320A may be provided with a second load electrode 372_2. In the example of FIG. 3A, the second load electrode 372_2 of the second transistor cell 320A may be implemented by a metal layer which covers another, separate part of the top surface of the second PR material body 140_2. That is, the first load electrode 362_2 and the second load electrode 372_2 of the second transistor cell 320A are separated from each other by, e.g., a gap. They are electrically coupled to each other by the second PR material body 140_2 of the second transistor cell 320A.

The second load electrode 372_2 of the second transistor cell 320A may be electrically connected to the second load terminal (S) 170 of the MottFET device 300.

In MottFET device 300 the electrical resistance of the first PR material body 140_1 and the electrical resistance of the second PR material body 140_2 are connected in series. In both MottFET devices 200, 300 the electrical resistance of the first PR material body 140_1 is a resistance for a load current flowing in a direction normal to the first PR material body 140_1. However, while in MottFET device 200 the electrical resistance of the second PR material body 140_2 is also a resistance for a load current flowing in a direction normal to the second PR material body 140_2, in MottFET device 300 the electrical resistance of the second PR material body 140_2 is a resistance for a load current flowing, at least partially, in a direction parallel to the second PR material body 140_2.

FIG. 3B illustrates a MottFET device 300' which is similar to the MottFET device 300 in that the first transistor cell 310 and a second transistor cell 320B are connected in series. However, the second transistor cell 320B is different from the second transistor cell 320A of MottFET device 300 in that the electrical resistance of the second PR material body 140_2 is a resistance for a load current flowing in a direction normal to the second PR material body 140_2.

To this end, the second transistor cell 320B may be provided with a first load electrode 3622, which may be located between the insulating layer 322 and the bottom of the second PR material body 140_2. The second metal layer (second electrode) 172_1 of the first transistor cell 310 may be electrically connected to the first load electrode 362_2 of the second transistor cell 320B. Again, the second load electrode 372_2 of the second transistor cell 320B may be connected to the second load terminal (S) 170 of the MottFET device 300'.

The MottFET devices 200, 300, 300' may be used as layer stack building blocks, which can be combined or extended to MottFET devices which include more than two transistor cells. Arbitrary combinations of these building blocks are possible, in particular combinations of connections in parallel (FIG. 2) and in series (FIGS. 3A, 3B). Several examples of such power MottFET devices are described further below.

Generally, the above disclosure to dimensions, materials, designs, in particular the design of the housing and/or the internal interconnect, can be applied to all examples described below.

The concept of connecting at least two transistor cells in parallel or in series allows to obtain MottFET devices which can be tailored to desired power applications, e.g. high voltage switching and/or high current switching. If the transistor cells are connected in series, the blocking capability of the MottFET device is enhanced. Parallelization of transistor cells improves the capability of switching high currents. Since both approaches (serial connection and parallelization) can be combined in a single MottFET device, it is possible to obtain desired power device characteristics by appropriate design of the MottFET device.

Figure 4:
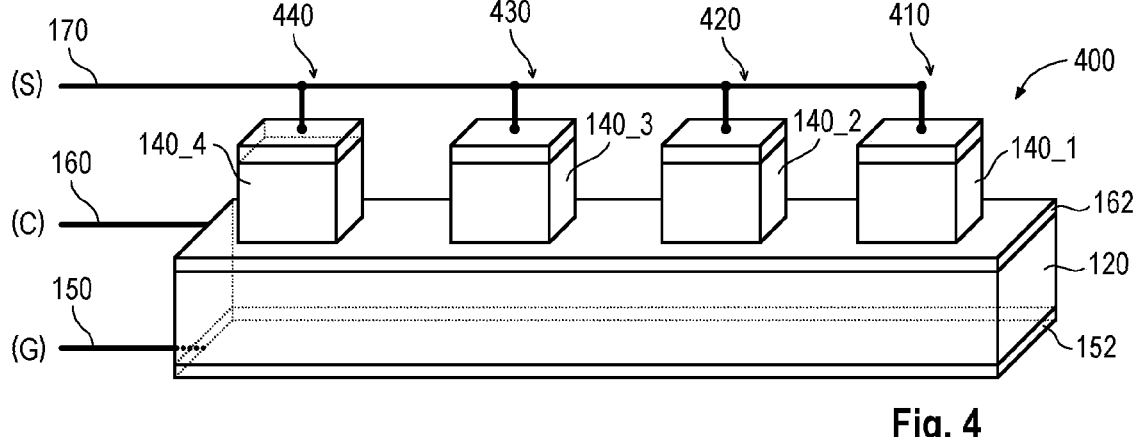
FIG. 4 is a perspective view on an internally parallel-connected piezoresistive transistor device having a layer or body stack including a piezoelectric material body and a plurality of piezoresistive material bodies.

FIG. 4 illustrates a MottFET device 400 in which multiple transistor cells 410, 420, 430, 440 are connected in parallel by an internal interconnect which uses, e.g., a common first metal layer 162 as first electrodes of the respective PR material bodies 140_1, 140_2, 140_3, 140_4. The common first metal layer 162 improves the load current distribution among the transistor cells 410, 420, 430, 440. This design is particularly suited for obtaining power MottFET devices with low tolerances in electrical specifications.

Figure 5:
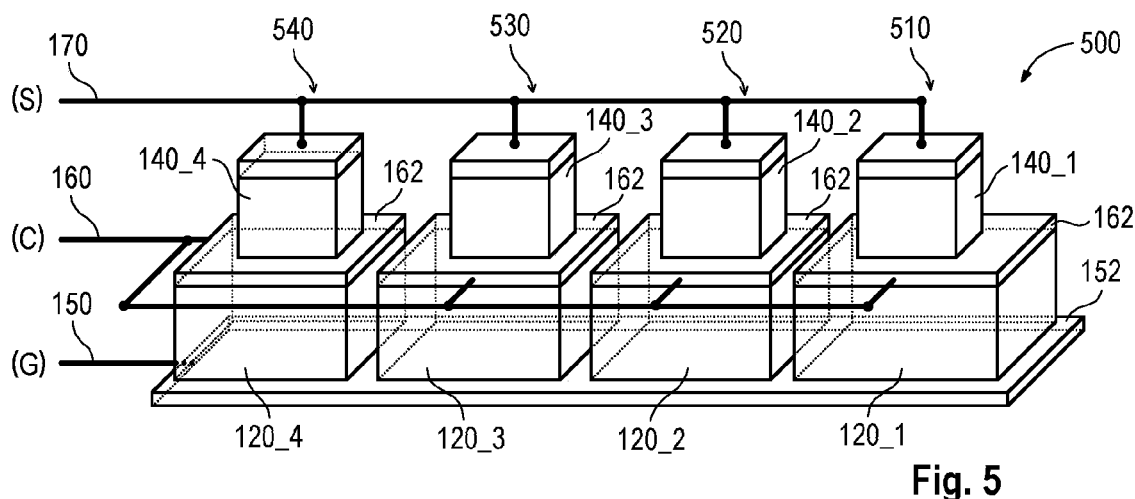
FIG. 5 is a perspective view on an internally parallel-connected piezoresistive transistor device having a layer or body stack including a plurality of piezoelectric material bodies and a plurality of piezoresistive material bodies.

FIG. 5 illustrates a MottFET device 500 which distinguishes from MottFET device 400 in that the first metal layers (first electrodes) 162 of the transistor cells are structurally separated from each other. Further, the PE material body 120 may (optionally) also be structurally separated in discrete PE material bodies 120_1, 120_2, 120_3, 120_4, or may be implemented as a common PE material body 120 as shown in FIG. 4. The internal electrical interconnect may be configured to electrically connect the first load terminal (C) 160 to all first metal layers (first electrodes) 162. In view of the second load terminal (S) 170, the electrical interconnect may be identical with the electrical interconnect of the MottFET device 400.

The MottFET device 500 provides for a parallelization of transistor cells 520, 520, 530, 540 which allows an enhanced current carrying capability.

Figure 6:
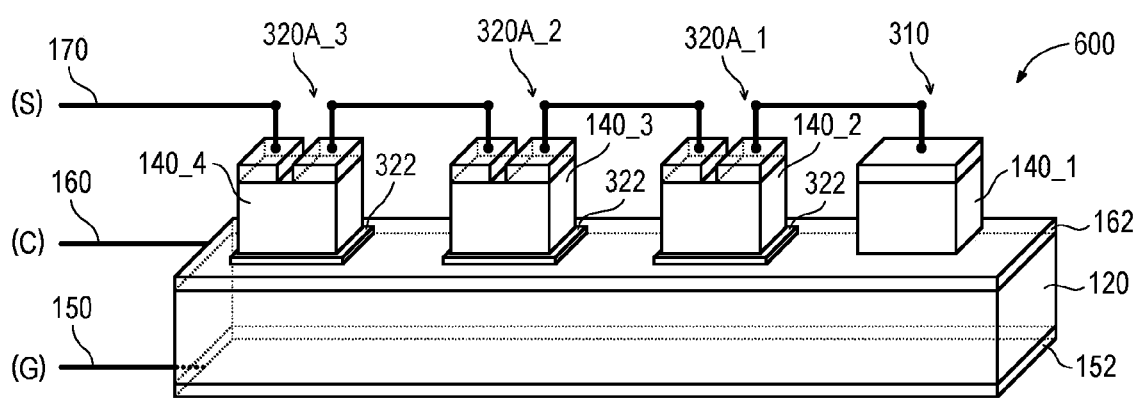
FIG. 6 is a perspective view on an internally series-connected piezoresistive transistor device according to the first series connection approach of FIG. 3A.
Figure 7:
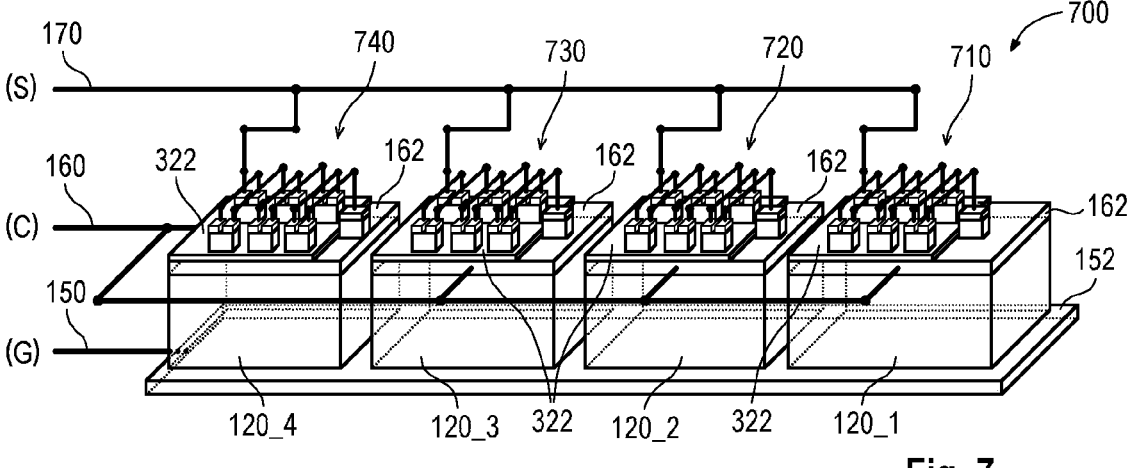
FIG. 7 is a perspective view on an internally serial- and parallel-connected piezoresistive transistor device, wherein the internal serial connections are of the first series connection approach of FIG. 3A.

FIGS. 6 and 7 illustrate further examples of multi-transistor cell MottFET devices 600, 700. In MottFET device 600 multiple transistor cells 310, 320A_1, 320A_2, 320A_3 are connected in series. While for purpose of explanation, the series connection design of FIG. 3A is used, in other examples the series connection design of FIG. 3B may be used.

Due to the insulating layer(s) 322 provided beneath the PR material bodies 140_2, 140_3, 140_4, the transistor cells 310, 320A_1, 320A_2, 320A_3 are kept in series during the blocking state, thereby providing a high blocking capability of the MottFET device 600. The number of transistor cells in series can be varied depending on the desired voltage class.

The MottFET device 700 relies on an internal electrical interconnect which provides for a mixed serial and parallel connection of multiple transistor cells. More specifically, the MottFET device 700 includes a control terminal (G) 150, a first load terminal (C) 160 and a second load terminal (S) 170. The MottFET device 700 includes at least a first plurality of transistor cells 710 and a second plurality of transistor cells 720. The MottFET device 700 further includes an internal electrical interconnect configured to electrically connect the electrical resistances of the first plurality of transistor cells 710 in series, to electrically connect the electrical resistance of the second plurality of transistor cells 720 in series, and to electrically connect these two series connections in parallel.

As illustrated in FIG. 7, further pluralities of transistor cells (here: e.g. four) may be internally interconnected in series and then connected in parallel, for example.

In MottFET device 700, the PE material bodies of the first plurality of transistor cells 710 are formed as a first common PE material body 120_1 and the PE material bodies of the second plurality of transistor cells 720 are similarly formed as a second common PE material body 120_2. The first and second common PE material bodies 120_1, 120_2 are, e.g., separated from each other. The control terminal (G) 150 is connected to a control electrode of the first common PE material body 120_1 and to a control electrode of the second common PE material body 120_2, respectively. The control electrodes may be provided by a continuous, common control metal layer 152, for example.

In MottFET device 700 the first load terminal (C) 160 may be connected to one or more first load electrodes 162 of a subset of transistor cells of each of the plurality of transistor cells 710, 720. In FIG. 7, only one transistor cell of each plurality of transistor cells 710, 720 is connected to each first load electrode 162, for example.

In MottFET device 700 the second load terminal (S) 170 may be connected to one or more second load electrodes of a subset of transistor cells of the first plurality of transistor cells 710 and to one or more second load electrodes of a subset of transistor cells of the second plurality of transistor cells 720. In the example shown the second load terminal 170 is connected to (only) one second load electrode of the respective subsets of transistor cells.

All examples described above may be applied to the MottFET device 700. For example, the internal serial connection of the plurality of transistor cells 710, 720, 730, 740 may be designed in accordance with FIG. 3B rather than FIG. 3A and/or the first metal layer(s) 162 may be a continuous metal layer and/or the PE material bodies 120_1, 120_2, 120_3, 120_4 may be formed by a common, continuous PE material body (e.g. layer) 120, etc.

As mentioned before, all MottFET devices 200, 300, 300', 400, 500, 600, 700 may include a housing structure having one or more cavities for receiving the first and second transistor cells 210, 220, 310, 320A, 320A_1-3, 320B, 410-440, 510-540 and/or first and second pluralities of transistor cells 710, 720. The cavities may be disposed adjacent to each other with respect to a lateral dimension of the housing structure.

Figure 8:
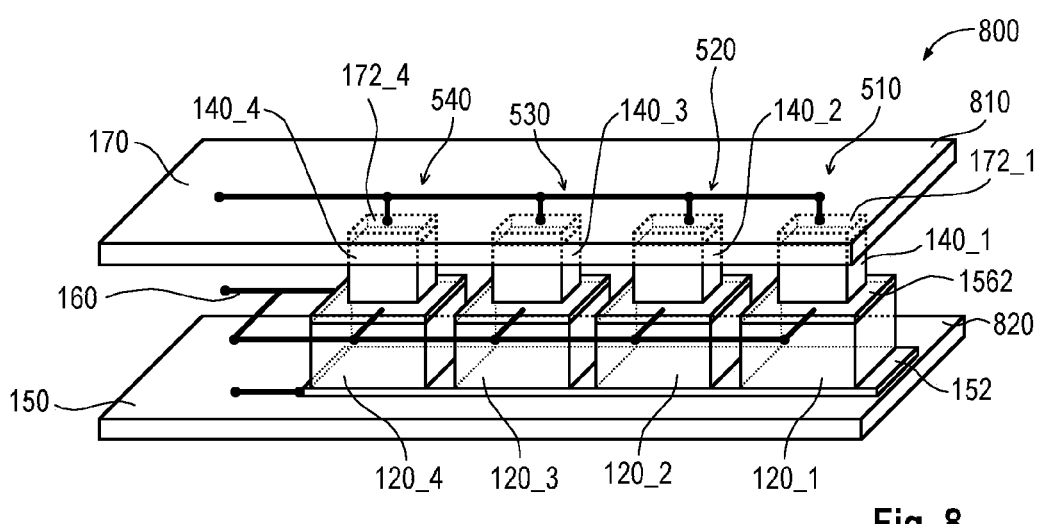
FIG. 8 is a perspective view on an example of a piezoresistive transistor device having the exemplary layer or body stack of FIG. 4 accommodated in a housing structure having an upper metal plate and a lower metal plate.

FIG. 8 illustrates a MottFET device 800 which includes a housing structure which comprises an upper metal plate 810 and a lower metal plate 820. The lower metal plate 820 may form the control terminal (G) 150 of the MottFET device 800 and/or the upper metal plate 810 may form the second load terminal (S) 170 of the MottFET device 800.

In FIG. 8 the transistor cells 510, 520, 530, 540 (see also FIG. 5) are placed between the upper metal plate 810 and the lower metal plate 820, for example. Any of the layer stacks of MottFET devices 100, 200, 300, 300', 400, 500, 600, 700 described above may be sandwiched between such metal plates 810, 820.

The metal plates 810, 820 may have the function of providing the control terminal 150 and the second load terminal 170 and/or may have (additionally) the function of forming clamping members which cause the pressure pulse from the PE material bodies 120_1, 120_2, 120_3, 120_4 to drive the Mott transition in the PR material bodies 140_1, 140_2, 140_3, 140_4.

In FIG. 8 the housing structure (see, e.g., the housing structure 180 of FIG. 1B) is not shown except the lower and upper metal plates 820, 810 forming a part of the housing structure. In all MottFET devices 100, 200, 300, 300', 400, 500, 600, 700, 800 described herein, the housing structure 180 may define a closed cavity 182 which may, e.g., be hermetically sealed.

In all MottFET devices described herein, the control metal layer 152 and/or the PE material body 120 and/or the first metal layer 162 and/or the PR material body 140 may have a circumferentially rounded or cylindrical shape (instead of a circumferentially rectangular shape as shown in the example illustrations) to avoid the occurrence of electrical potential peaks at corners. Further, the metal plates 810, 820 can have a circumferentially rounded (e.g. cylindrical) shape or a substantially rectangular shape.

Figure 9:
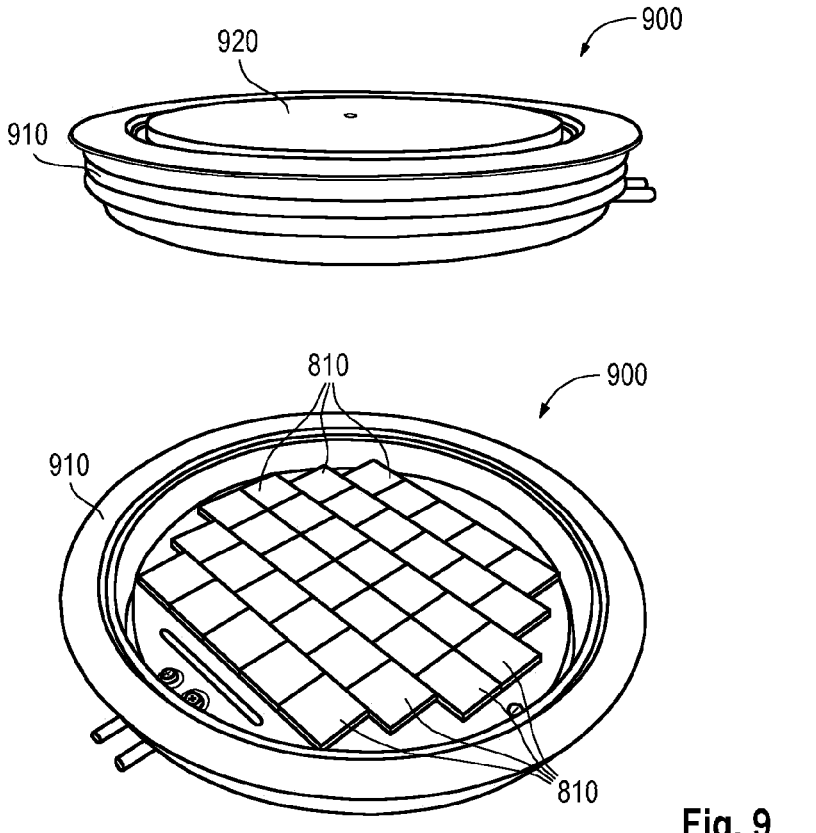
FIG. 9 are perspective views showing a package including a plurality of housing structures of FIG. 8.

FIG. 9 illustrates a package 900 which includes a plurality of housing structures or MottFET devices, e.g. MottFET devices 800 as shown in FIG. 8. The package 900 may be a so-called press-pack package. The package 900 comprises a bottom part 910 and a cap part 920. The cap part 920 can be screwed or otherwise rigidly fixed to the bottom part 910.

When the cap part 920 is fixed to the bottom part 910, the interior of the package 900 may be hermetically sealed.

The MottFET device 800 (or other MottFET devices 100 to 700) is placed in the interior of the bottom part 910. In FIG. 9 an array of such MottFET devices 800 can be accommodated in the package 900. The upper metal plates 810 of the MottFET devices 800 may be exposed in the unclosed state of the package 900. When the package 900 is closed by fixing the cap part 920 to the bottom part 910, the upper metal plates 810 may be pressed down and electrically connected to the cap part 920. Hence, the cap part 920 (which may be electrically isolated against the bottom part 910) may serve as a common package load terminal connecting to the second load terminals (S) 170 of the MottFET devices 800. That way, the package 900 itself represents a MottFET device containing a plurality of internal MottFET devices connected in parallel.

FIG. 10A illustrates a MottFET device 1000 having a housing structure 1080 which is provided with a plurality of cavities 182 for receiving transistor cells as described above. The cavities 182 are disposed adjacent to each other with respect to a lateral dimension of the housing structure 1080.

In MottFET device 1000 the PE material bodies 120 and the PR material bodies 140 of the transistor cells are oriented perpendicular (or, more generally, inclined) to the lateral dimension of the housing structure 1080. It is also possible, that these PE material bodies 120 at least partially surround the PR material body 140.

The housing structure 1080 may, e.g., include a first substrate 1080_1 and a second substrate 1080_2. The first substrate 1080_1 may, e.g., be a wafer or part of a wafer (e.g. chip) and/or the second substrate 1080_2 may be a wafer or a part of a wafer (e.g. chip). The material of the first substrate 1080_1 may, e.g., be a HSM and/or the material of the second substrate 1080_2 may, e.g., be a HSM. For example, the material of the first substrate 1080_1 and/or of the second substrate 1080_2 may be silicon or silicon carbide or silicon nitride. Other materials, which could be used for the first and/or second substrates 1080_1, 1080_2, are glass, sapphire, or fused silica. For example, the first substrate 1080_1 may be made of silicon and the second substrate 1080_2 may be made of silicon nitride.

The cavities 182 may be generated by isotropic etching in the first substrate 1080_1. Known MEMS (microelectromechanical systems) techniques may be used.

The first substrate 1080_1 and the second substrate 1080_2 may, e.g., be bonded together by wafer bonding or other techniques known in the art.

In the example shown the MottFET device 1000 includes, e.g., a single transistor cell per cavity. However, it is also possible that some or all of the cavities 182 are configured to receive a plurality of transistor cells. For example, a first cavity 182 may receive a first plurality of transistor cells 710 (see FIG. 7), a second cavity 182 may receive a second plurality of transistor cells 720, etc. In this case, the MottFET device 1000 may be used to implement MottFET device 700 as shown in FIG. 7.

In general, each cavity 182 may receive any of the MottFET devices 100 to 800 as described above. The MottFET device 1000 then includes a further internal connect (not shown) configured to connect these MottFET devices 100 to 800 in series or in parallel.

In other words, based on the "building blocks" of FIGS. 2, 3A and 3B and the illustrated examples of MottFET devices, a variety of different modules may be obtained.

FIG. 10B illustrates a MottFET device 1000' having a housing structure 1080 which is similar or identical to the housing structure 1080 of FIG. 10A, and reference is made to the above description. The MottFET device 1000' uses a layer stack in which PR material body(bodies) 140 are arranged at opposite sides of the PE material body 120 per cavity 182. This can be realized by a two-dimensional layer stack in which all layers 120, 140 162, 172 are normal to the paper plane, or by a radially symmetric layer stack in which the PE material body 120 is central (and, e.g., formed as a cylinder) and is surrounded by the first metal layer 162, the PR material body 140 and the second metal layer 172 in a radial direction. Here, the expansion of the PE material is used in at least two opposite directions (or in all radial directions, for example) for actuating the PR material body (bodies) 140, allowing to increase the amount of PR material and thus the power density of the MottFET device 1000'.

FIGS. 11A and 11B illustrate examples of MottFET devices 1100 and 1100', respectively, in which at least two transistor cells are oriented in different spatial directions. For example, a first transistor cell 210 includes a first PE material body 120_1 and a first PR material body 140_1. The first PE material body 120_1 and the first PR material body 140_1 are arranged in a stacked configuration.

Further, the MottFET device 1100 includes a second transistor cell 220. The second transistor cell 220 includes a second PE material body 120_2 (which, in the example shown, is made of the same PE material as the first PE material body 120_1) and a second PR material body 140_2. The second PE material body 120_2 and the second PR material body 140_2 are arranged in a stacked configuration.

The first PR material body 140_1 and the second PR material body 140_2 are oriented in different spatial planes which are not parallel to each other. For example, while the first PR material body 140_1 may be oriented in the X-Z plane, the second PR material body 140_2 may be oriented in the X-Y plane.

The first PE material body 120_1 and the second PE material body 120_2 may be formed as a common, structured PE material body 120, as depicted. The structured PE material body 120 has side faces. The first PR material body 140_1 (of the first transistor cell 210) may extend over the top surface of the common, structured PE material body 120, while the second PR material body 140_2 (of the second transistor cell 220) may extend over a side face of the structured PE material body 120.

The common, structured PE material body 120 may exert strain in all directions X, Y, Z and −X, −Y, −Z upon activation.

For example, the MottFET device 1100 may include a common control metal layer 152, which may be shaped, e.g., as a fin or as a bar. The structured PE material body may encapsulate the common control metal layer 152 at least at two sides, e.g. at the top side and at one or both side faces. Further, the first metal layer 162 may cover the structured PE material body at least at two sides. Differently stated, the structured PE material body may be encapsulated by the first metal layer 162 at, e.g., two, or three, or four sides.

As to the internal electrical interconnect, FIG. 11A illustrates by way of example an implementation in which the first and second transistor cells 210, 220 are connected in parallel. This compares to the exemplary implementation of the MottFET device 200 of FIG. 2. However, it is also possible that the first and second transistor cells 210, 220 are connected in series. In this respect, the specific implementations illustrated in FIGS. 3A and 3B can be directly applied to the "three-dimensional" MottFET device 1100', for example.

While the first and second transistor cells 210, 220 are oriented in different spatial directions (in this example in the Y direction and the −Z direction), another transistor cell 1230 may, e.g., be oriented in the third dimension (in this example, the −X direction). In general, the at least two transistor cells 210, 220, 1230 described herein should be directed in at least two different spatial directions.

FIG. 11A shows the internal electrical interconnect only for two transistor cells 210 and 220. However, all transistor cells depicted in FIG. 11A may be connected either in series or in parallel or partly in parallel and partly in series to each other, see, e.g., FIG. 7.

FIG. 11B illustrates a further implementation of a "three-dimensional" MottFET device 1100'. The MottFET device 1100' uses a plurality of MottFET devices 1100 as building blocks, interconnected in parallel or in series or by a mixed series-and-parallel electrical interconnect (not shown).

For ease of illustration, FIGS. 11A and 11B are not showing the housing structure allowing the strain exerted by the structured PE material body 120 to be applied as a compressive force to the various PR material bodies 140_1, 140_2 of the transistor cells 210, 220, 1230. Housing structures as described above could be used.

Owing to its specific application requirements in power electronics, a multitude of such Mott transistor cells 210, 220, 1230 ("Mott switches") could be utilizing the same bus (i.e. the same PE material body 120) that initiates the insulator to metal transition in the various Mott switches.

The encapsulation scheme disclosed above allows to utilize the different surfaces of the structured PE material body 120 (which could also referred to as a "PE bar"), allowing to pack more power densities for such an exemplary Mott transistor based power switch as, e.g., exemplified by MottFET devices 1100 or 1100'.

Figure 12:
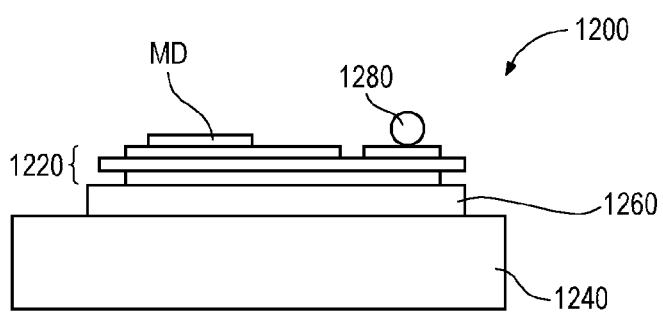
FIG. 12 shows a power electronic module including a piezoresistive transistor device, a carrier on which the piezoresistive transistor device is mounted and a heatsink attached to the carrier.

FIG. 12 illustrates a power electronic module 1200 which includes a MottFET device MD. The MottFET device MD may, e.g., be any of the MottFET devices 100 to 800 or 1000, 1000', 1100, 1100' described above, or any variants or combinations thereof.

The power electronic module 1200 further includes a carrier 1220. The carrier 1220 may, e.g., be a leadframe, a PCB or any other known carrier such as, e.g., a ceramic based carrier. The MottFET device MD is mounted on the carrier 1220.

The power electronic module 1200 may further include a heat sink 1240. The heat sink 1240 is attached to the carrier 1220. For example, a base plate 1260 may be placed between the heat sink 1240 and the carrier 1220. The base plate 1260 as well as the heat sink 1240 may, e.g., be made a metal (e.g. at least one of copper, titanium, titanium nitride, aluminum, tungsten, tantalum, tantalum nitride) or ceramic (e.g. AlN, $Al_2O_3$, . . . ).

The power electronic module 1200 may further include a temperature sensor 1280. The temperature sensor may, e.g., be a thermistor also known as an NTC (negative temperature coefficient) thermistor. The temperature sensor 1280 may be configured to monitor the temperature in the power electronic module 1200. The power electronic module 1200 may have a threshold voltage in a range between 1.2 to 30 V.

Figure 13:
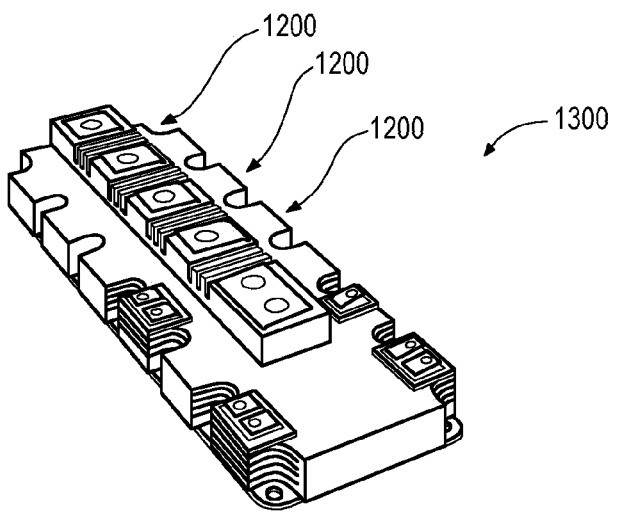
FIG. 13 shows an assembly of power electronic modules arranged in a row.

FIG. 13 illustrates an exemplary assembly 1300 of power electronic modules 1200 arranged in a row. For example, the power electronic modules 1200 may be designed in accordance with FIG. 12. The power electronic modules 1200 are assembled terminal-to-terminal in the direction of the row (i.e. in the lateral direction) and terminal-to-heat sink in the vertical direction.

Figure 14:
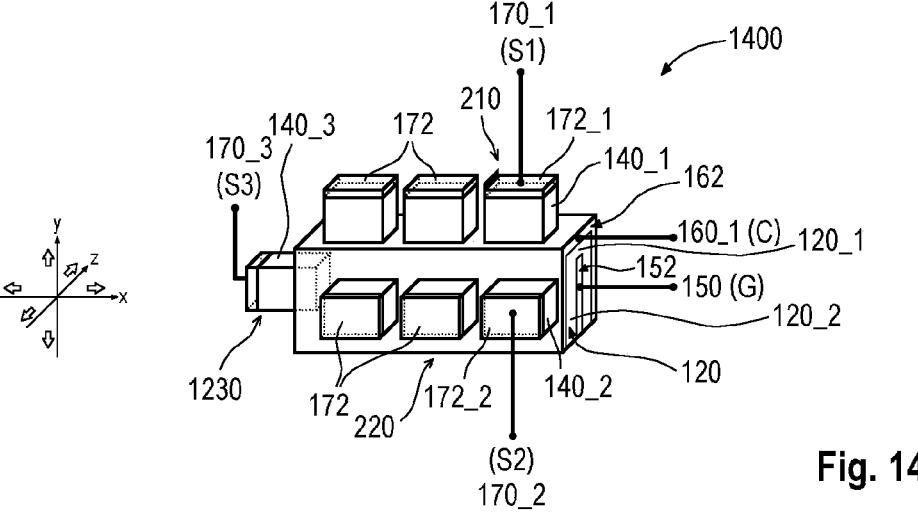
FIG. 14 is a perspective view on an exemplary piezoresistive transistor device in which a first transistor cell and a second transistor cell are oriented in different spatial directions.

FIG. 14 is a perspective view on an exemplary MottFET device 1400. The MottFET device 1400 is different from all MottFET devices described above in that there needs not to be an internal interconnect by which transistor cells 210, 220, are connected either in series or in parallel. In particular, the MottFET device 1400 may, e.g., be a non-power or logic transistor device.

As in FIGS. 11A and 11B to which reference is made to avoid reiteration, at least two transistor cells are oriented in different spatial directions. In other words, the first PR material body 140_1 (of the first transistor cell 210) and the second PR material body 140_2 (of the second transistor cell 220) are oriented in different spatial planes which are not parallel to each other. For example, while the first PR material body 140_1 may be oriented in the X-Z plane, the second PR material body 140_2 may be oriented in the X-Y plane.

As described above, the first PE material body 120_1 and the second PE material body 120_2 are formed as a common, structured PE material body 120, as depicted. The structured PE material body 120 has side faces. The first PR material body 140_1 (of the first transistor cell 210) may extend over the top surface of the common, structured PE material body 120, while the second PR material body 140_2 (of the second transistor cell 220) may extend over a side face of the structured PE material body 120.

The structured PE material body 120 may encapsulate the common control metal layer 152 at least at two sides, e.g. at the top side and at one or both side faces. Further, the first metal layer 162 may cover the structured PE material body at least at two sides. Differently stated, the structured PE material body 120 may be encapsulated by the first metal layer 162 at, e.g., two, or three or four sides.

The MottFET device 1400 may have the following external terminals:

A control terminal 150 (G) of the MottFET device 1400 is connected to a control electrode 152, the control electrode 152 being connected to the first PE material body 120_1 and the second PE material body 120_2 which are here formed as a common PE material body 120.

A first terminal 160_1 (C) of the MottFET device 1400 may be connected to a first electrode 162 of the first transistor cell 210, which is arranged between the PE material body 120 and the first PR material body 140_1, and to a second electrode 162 of the second transistor cell 220, which is arranged between the PE material body 120 and the second PR material body 140_2.

A second terminal 170_1 (S1) of the MottFET device 1400 may be connected to a second electrode 172_1 of the first transistor cell 210, the second electrode 172_1 being arranged on the first PR material body 140_1.

A third terminal 170_2 (S2) of the MottFET device 1400 may be connected to a second electrode 172_2 of the second transistor cell 220, the second electrode 172_2 being arranged on the second PR material body 140_2.

That is, the "three-dimensional" MottFET device 1400 may have a number of external terminals equal to or greater than 4.

Similar as already described in conjunction with FIGS. 11A, 11B, another transistor cell 1230 may, e.g., be oriented in the third dimension (in this example, the –X direction). A fourth terminal 170_3 (S3) of the MottFET device 1400 may be connected to a second electrode of the transistor cell 1230, the second electrode being arranged on the third PR material body 140_3.

In general, the at least two transistor cells 210, 220, 1230 described herein should be directed in at least two different spatial directions. For example, the third PR material body 140_3 is oriented in a spatial plane which is not parallel to any of the spatial planes in which the first PR material body 140_1 and the second PR material body 140_2 are oriented.

FIG. 14 shows the device terminals of a two or three transistor cell 210, 220, 1230 MottFET device 1400. However, all transistor cells depicted in FIG. 14 may be connected to separate device terminals the same way as exemplified for transistor cells 210, 220, 1230. Further, the MottFET device 1400 may be extended the same way as shown in FIG. 11B.

For ease of illustration, FIG. 14 does not show the housing structure allowing the strain exerted by the structured PE material body 120, (120_1, 120_2) to be applied as a compressive force to the various PR material bodies 140_1, 140_2, 140_3, 140 of the transistor cells 210, 220, 1230. Housing structures as described above could be used.

For example in logic devices, a multitude of such Mott transistor cells 210, 220, 1230 ("Mott switches") could be utilizing the same "bus" (i.e. the same PE material body 120, which is also referred to as a "PE bus bar") that initiates the insulator to metal transition in the various Mott switches. The usage of a common PE bus bar for a plurality of transistor cells 210, 220, . . . as exemplified in FIGS. 2, 3A, 3B, 4, 6, 7 (partly), 11A, 11B, 14 is an (optional) feature applicable to all examples of this disclosure.

The encapsulation scheme disclosed above allows to utilize the different surfaces of the structured PE material body 120, allowing to pack more transistor cells in a single MottFET device 1400 (having at least two transistor cells 210, 220).

The following examples pertain to further aspects of the disclosure:

Example 1 is a piezoresistive transistor device comprises a first transistor cell. The first transistor cell comprises a first piezoelectric material body and a first piezoresistive material body. The first piezoelectric material body and the first piezoresistive material body are arranged in a stacked configuration, and a first electrical resistance of the first piezoresistive material body is dependent upon a voltage applied across the first piezoelectric material body by way of a pressure applied by the first piezoelectric material body to the first piezoresistive material body. The piezoresistive transistor device comprises a second transistor cell. The second transistor cell comprises a second piezoelectric material body and a second piezoresistive material body. The second piezoelectric material body and the second piezoresistive material body are arranged in a stacked configuration, and a second electrical resistance of the second piezoresistive material body is dependent upon a voltage applied across the second piezoelectric material body by way of a pressure applied by the second piezoelectric material body to the second piezoresistive material body. The piezoresistive transistor device comprises a control terminal, a first load terminal, a second load terminal and an internal electrical interconnect configured to electrically connect the first electrical resistance and the second electrical resistance in series or in parallel.

In Example 2, the subject matter of Example 1 can optionally include wherein the first piezoelectric material body and the second piezoelectric material body are formed as a common piezoelectric material body.

In Example 3, the subject matter of Example 1 can optionally include wherein the first piezoelectric material body and the second piezoelectric material body are separate from each other.

In Example 4, the subject matter of any preceding Example can optionally include wherein the control terminal is connected to a control electrode, the control electrode being connected to the first piezoelectric material body and the second piezoelectric material body.

In Example 5, the subject matter of any preceding Example can optionally include wherein, in the case the internal electrical interconnect is configured to connect the first electrical resistance and the second electrical resistance in parallel, the first load terminal is connected to a first load electrode of the first transistor cell and a first load electrode of the second transistor cell, the first load electrode of the first transistor cell being arranged between the first piezoelectric material body and the first piezoresistive material body and the first load electrode of the second transistor cell being arranged between the second piezoelectric material body and the second piezoresistive material body.

In Example 6, the subject matter of Example 5 can optionally include wherein, in the case the internal electrical interconnect is configured to connect the first electrical resistance and the second electrical resistance in parallel, the second load terminal is connected to a second load electrode of the first transistor cell and a second load electrode of the second transistor cell, the second load electrode of the first transistor cell being arranged at a side of the first piezoresistive material body facing away from the first piezoelectric material body and the second load electrode of the second transistor cell being arranged at a side of the second piezoresistive material body facing away from the second piezoelectric material body.

In Example 7, the subject matter of Example 5 or 6 can optionally include wherein the first electrical resistance is a resistance for a load current flowing in a direction normal to the first piezoresistive material body, and the second electrical resistance is a resistance for a load current flowing in a direction normal to the second piezoresistive material body.

In Example 8, the subject matter of any of Examples 1 to 4 can optionally include wherein, in the case the internal electrical interconnect is configured to connect the first electrical resistance and the second electrical resistance in series, the first load terminal is connected to a first load electrode of the first transistor cell which is arranged between the first piezoelectric material body and the first piezoresistive material body, and a second load electrode of the first transistor cell is connected to a first load electrode of the second transistor cell, wherein the first load electrode of the second transistor cell is not connected to the first load terminal.

In Example 9, the subject matter of Example 8 can optionally include wherein the second load terminal is connected to the second load electrode of the second transistor cell.

In Example 10, the subject matter of Example 8 or 9 can optionally include wherein the first and second load electrodes of the second transistor cell are arranged at a side of the second piezoresistive material body facing away from the second piezoelectric material body.

In Example 11, the subject matter of any Example 8 to 10 can optionally include wherein the first electrical resistance is a resistance for a load current flowing in a direction normal to the first piezoresistive material body, and the second electrical resistance is a resistance for a load current flowing at least partly in a direction parallel to the second piezoresistive material body.

In Example 12, the subject matter of Example 8 or 9 optionally include wherein the first electrical resistance is a resistance for a load current flowing in a direction normal to the first piezoresistive material body, and the second electrical resistance is a resistance for a load current flowing in a direction normal to the second piezoresistive material body.

In Example 13, the subject matter of any preceding Example can optionally further include a housing structure having at least one cavity for receiving the first transistor cell and the second transistor cell, wherein the housing structure comprises an upper metal plate and a lower metal plate, the lower metal plate forming the control terminal of the piezoresistive transistor device and the upper metal plate forming the second load terminal of the piezoresistive transistor device.

In Example 14, the subject matter of any of Examples 1 to 12 can optionally further include a housing structure having a first cavity receiving the first transistor cell and a second cavity receiving the second transistor cell, the cavities being disposed adjacent to each other with respect to a lateral dimension of the housing structure.

In Example 15, the subject matter of Example 14 can optionally include wherein the first piezoelectric material body and the first piezoresistive material body are oriented parallel to the lateral dimension of the housing and/or the second piezoelectric material body and the second piezoresistive material body are oriented parallel to the lateral dimension of the housing.

In Example 16, the subject matter of Example 14 can optionally include wherein the first piezoelectric material body and the first piezoresistive material body are oriented inclined or perpendicular to the lateral dimension of the housing and/or the second piezoelectric material body and the second piezoresistive material body are oriented inclined or perpendicular to the lateral dimension of the housing.

In Example 17, the subject matter of any of the preceding Examples can optionally include wherein the first piezoresistive material body and the second piezoresistive material body are oriented in different spatial planes which are not parallel to each other.

Example 18 is a piezoresistive transistor device comprising a first plurality of transistor cells and a second plurality of transistor cells. Each transistor cell comprises a piezoelectric material body, and a piezoresistive material body, wherein the piezoelectric material body and the piezoresistive material body are arranged in a stacked configuration and an electrical resistance of the piezoresistive material body is dependent upon a voltage applied across the piezoelectric material body by way of a pressure applied by the piezoelectric material body to the piezoresistive material body. The piezoresistive transistor device further comprises a control terminal, a first load terminal, a second load terminal and an internal electrical interconnect configured to electrically connect the electrical resistances of the first plurality of transistor cells in series, to electrically connect the electrical resistances of the second plurality of transistor cells in series, and to electrically connect these two series connections in parallel.

In Example 19, the subject matter of Example 18 can optionally include wherein the piezoelectric material bodies of the first plurality of transistor cells are formed as a first common piezoelectric material body, the piezoelectric material bodies of the second plurality of transistor cells are formed as a second common piezoelectric material body, and the control terminal is connected to a first control electrode and a second control electrode, the first and second control electrodes being connected to the first common piezoelectric material body and to the second common piezoelectric material body, respectively.

In Example 20, the subject matter of Example 18 or 19 can optionally include wherein the first load terminal is connected to one or more first load electrodes of a subset of transistor cells of the first plurality of transistor cells and to one or more first load electrodes of a subset of transistor cells of the second plurality of transistor cells, wherein the one or more first load electrodes are arranged at a side of the piezoresistive material bodies facing the piezoelectric material bodies.

In Example 21, the subject matter of any of Examples 18 to 20 can optionally include wherein the second load terminal is connected to one or more second load electrodes of a subset of transistor cells of the first plurality of transistor cells and to one or more second load electrodes of a subset of transistor cells of the second plurality of transistor cells, wherein the one or more second load electrodes are arranged at a side of the piezoresistive material bodies facing away from the piezoelectric material bodies.

In Example 22, the subject matter of any Examples 18 to 21 can optionally further include a housing structure having a first cavity receiving the first plurality of transistor cells and a second cavity receiving the second plurality of transistor cells, the cavities being disposed adjacent to each other with respect to a lateral dimension of the housing structure.

In Example 23, the subject matter of Example 22 can optionally include wherein the first plurality of transistor cells is received in the first cavity with the piezoelectric material bodies and the piezoresistive material bodies oriented inclined or perpendicular to the lateral dimension of the housing and/or the second plurality of transistor cells is received in the second cavity with the piezoelectric material bodies and the piezoresistive material bodies being oriented inclined or perpendicular to the lateral dimension of the housing.

In Example 24, the subject matter of any of Examples 18 to 23 can optionally include wherein the piezoresistive transistor device is a power device.

In Example 25, the subject matter of Example 24 can optionally include wherein the piezoresistive transistor device has a threshold voltage in a range between 1.2 V and 30 V.

Example 26 is a power electronic module including the piezoresistive transistor device of Example 24 or 25, a carrier on which the piezoresistive transistor device is mounted and a heatsink attached to the carrier.

In Example 27, the subject matter of Example 26 can optionally include a temperature sensor mounted on the carrier.

Example 28 is a piezoresistive transistor device comprising a first transistor cell. The first transistor cell comprises a piezoelectric material body and a first piezoresistive material body. The piezoelectric material body and the first piezoresistive material body are arranged in a stacked configuration. A first electrical resistance of the first piezoresistive material body is dependent upon a voltage applied across the piezoelectric material body by way of a pressure applied by the piezoelectric material body to the first piezoresistive material body. The piezoresistive transistor device further comprises a second transistor cell. The second transistor cell comprises the piezoelectric material body and a second piezoresistive material body. The piezoelectric material body and the second piezoresistive material body are arranged in a stacked configuration. A second electrical resistance of the second piezoresistive material body is dependent upon a voltage applied across the piezoelectric material body by way of a pressure applied by the piezoelectric material body to the second piezoresistive material body. The first piezoresistive material body and the second piezoresistive material body are oriented in different spatial planes which are not parallel to each other.

In Example 29, the subject matter of Example 28 can optionally further include a control terminal of the piezoresistive transistor device which is connected to a control electrode, the control electrode being connected to the piezoelectric material body; a first terminal of the piezoresistive transistor device, the first terminal being connected to a first electrode of the first transistor cell which is arranged between the piezoelectric material body and the first piezoresistive material body and to a second electrode of the second transistor cell which is arranged between the piezoelectric material body and the second piezoresistive material body; a second terminal of the piezoresistive transistor device, the second terminal being connected to a second electrode of the first transistor cell, the second electrode of the first transistor cell is arranged on the first piezoresistive material body; and a third terminal of the piezoresistive transistor device, the third terminal being connected to a second electrode of the second transistor cell, the second electrode of the second transistor cell is arranged on the second piezoresistive material body.

In Example 30, the subject matter of Example 28 or 29 can optionally further include a third transistor cell comprising the piezoelectric material body and a third piezoresistive material body, wherein the piezoelectric material body and the third piezoresistive material body are arranged in a stacked configuration. A third electrical resistance of the third piezoresistive material body is dependent upon a voltage applied across the piezoelectric material body by way of a pressure applied by the piezoelectric material body to the third piezoresistive material body. The third piezoresistive material body is oriented in a spatial plane which is not parallel to any of the spatial planes in which the first piezoresistive material body and the second piezoresistive material body are oriented.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A piezoresistive transistor device, comprising:
a first transistor cell comprising a first piezoelectric material body and a first piezoresistive material body, wherein the first piezoelectric material body and the first piezoresistive material body are arranged in a stacked configuration, wherein a first electrical resistance of the first piezoresistive material body is dependent upon a voltage applied across the first piezoelectric material body by way of a pressure applied by the first piezoelectric material body to the first piezoresistive material body;
a second transistor cell comprising a second piezoelectric material body and a second piezoresistive material body, wherein the second piezoelectric material body and the second piezoresistive material body are arranged in a stacked configuration, wherein a second electrical resistance of the second piezoresistive material body is dependent upon a voltage applied across the second piezoelectric material body by way of a pressure applied by the second piezoelectric material body to the second piezoresistive material body;

a control terminal of the piezoresistive transistor device;

a first load terminal of the piezoresistive transistor device;

a second load terminal of the piezoresistive transistor device; and an internal electrical interconnect of the piezoresistive transistor device configured to electrically connect the first electrical resistance and the second electrical resistance in series or in parallel.

2. The piezoresistive transistor device of claim 1, wherein the first piezoelectric material body and the second piezoelectric material body are formed as a common piezoelectric material body.

3. The piezoresistive transistor device of claim 1, wherein the first piezoelectric material body and the second piezoelectric material body are separate from each other.

4. The piezoresistive transistor device of claim 1, wherein the control terminal is connected to a control electrode, the control electrode being connected to the first piezoelectric material body and the second piezoelectric material body.

5. The piezoresistive transistor device of claim 1, wherein if the internal electrical interconnect is configured to connect the first electrical resistance and the second electrical resistance in parallel, the first load terminal is connected to a first load electrode of the first transistor cell and a first load electrode of the second transistor cell, the first load electrode of the first transistor cell being arranged between the first piezoelectric material body and the first piezoresistive material body and the first load electrode of the second transistor cell being arranged between the second piezoelectric material body and the second piezoresistive material body.

6. The piezoresistive transistor device of claim 5, wherein the first electrical resistance is a resistance for a load current flowing in a direction normal to the first piezoresistive material body, and wherein the second electrical resistance is a resistance for a load current flowing in a direction normal to the second piezoresistive material body.

7. The piezoresistive transistor device of claim 1, wherein if the internal electrical interconnect is configured to connect the first electrical resistance and the second electrical resistance in parallel, the second load terminal is connected to a second load electrode of the first transistor cell and a second load electrode of the second transistor cell, the second load electrode of the first transistor cell being arranged at a side of the first piezoresistive material body facing away from the first piezoelectric material body and the second load electrode of the second transistor cell being arranged at a side of the second piezoresistive material body facing away from the second piezoelectric material body.

8. The piezoresistive transistor device of claim 7, wherein the first electrical resistance is a resistance for a load current flowing in a direction normal to the first piezoresistive material body, and wherein the second electrical resistance is a resistance for a load current flowing in a direction normal to the second piezoresistive material body.

9. The piezoresistive transistor device of claim 1, wherein if the internal electrical interconnect is configured to connect the first electrical resistance and the second electrical resistance in series, the first load terminal is connected to a first load electrode of the first transistor cell which is arranged between the first piezoelectric material body and the first piezoresistive material body, and a second load electrode of the first transistor cell is connected to a first load electrode of the second transistor cell, wherein the first load electrode of the second transistor cell is not connected to the first load terminal.

10. The piezoresistive transistor device of claim 9, wherein the second load terminal is connected to the second load electrode of the second transistor cell.

11. The piezoresistive transistor device of claim 9, wherein the first and second load electrodes of the second transistor cell are arranged at a side of the second piezoresistive material body facing away from the second piezoelectric material body.

12. The piezoresistive transistor device of claim 9, wherein the first electrical resistance is a resistance for a load current flowing in a direction normal to the first piezoresistive material body, and wherein the second electrical resistance is a resistance for a load current flowing at least partly in a direction parallel to the second piezoresistive material body.

13. The piezoresistive transistor device of claim 9, wherein the first electrical resistance is a resistance for a load current flowing in a direction normal to the first piezoresistive material body, and wherein the second electrical resistance is a resistance for a load current flowing in a direction normal to the second piezoresistive material body.

14. The piezoresistive transistor device of claim 1, further comprising:

a housing structure having at least one cavity for receiving the first transistor cell and the second transistor cell, wherein the housing structure comprises an upper metal plate and a lower metal plate, the lower metal plate forming the control terminal of the piezoresistive transistor device and the upper metal plate forming the second load terminal of the piezoresistive transistor device.

15. The piezoresistive transistor device of claim 1, further comprising:

a housing structure having a first cavity receiving the first transistor cell and a second cavity receiving the second transistor cell, the cavities being disposed adjacent to each other with respect to a lateral dimension of the housing structure.

16. The piezoresistive transistor device of claim 15, wherein the first piezoelectric material body and the first piezoresistive material body are oriented parallel to the lateral dimension of the housing and/or the second piezoelectric material body and the second piezoresistive material body are oriented parallel to the lateral dimension of the housing.

17. The piezoresistive transistor device of claim 15, wherein the first piezoelectric material body and the first piezoresistive material body are oriented inclined or perpendicular to the lateral dimension of the housing and/or the second piezoelectric material body and the second piezoresistive material body are oriented inclined or perpendicular to the lateral dimension of the housing.

18. The piezoresistive transistor device of claim 1, wherein the first piezoresistive material body and the second piezoresistive material body are oriented in different spatial planes which are not parallel to each other.

19. A piezoresistive transistor device, comprising:

a first plurality of transistor cells and a second plurality of transistor cells, wherein each transistor cell comprises a piezoelectric material body and a piezoresistive material body, wherein the piezoelectric material body and the piezoresistive material body are arranged in a stacked configuration, wherein an electrical resistance of the piezoresistive material body is dependent upon a voltage applied across the piezoelectric material body by way of a pressure applied by the piezoelectric material body to the piezoresistive material body;

a control terminal of the piezoresistive transistor device;

a first load terminal of the piezoresistive transistor device;

a second load terminal of the piezoresistive transistor device; and an internal electrical interconnect of the piezoresistive transistor device configured to electrically connect the electrical resistances of the first plurality of transistor cells in series, to electrically connect the electrical resistances of the second plurality of transistor cells in series, and to electrically connect these two series connections in parallel.

20. The piezoresistive transistor device of claim 19, wherein:

the piezoelectric material bodies of the first plurality of transistor cells are formed as a first common piezoelectric material body;

the piezoelectric material bodies of the second plurality of transistor cells are formed as a second common piezoelectric material body; and the control terminal is connected to a first control electrode and a second control electrode, the first and second control electrodes being connected to the first common piezoelectric material body and to the second common piezoelectric material body, respectively.

21. The piezoresistive transistor device of claim 19, wherein the first load terminal is connected to one or more first load electrodes of a subset of transistor cells of the first plurality of transistor cells and to one or more first load electrodes of a subset of transistor cells of the second plurality of transistor cells, wherein the one or more first load electrodes are arranged at a side of the piezoresistive material bodies facing the piezoelectric material bodies.

22. The piezoresistive transistor device of claim 19, wherein the second load terminal is connected to one or more second load electrodes of a subset of transistor cells of the first plurality of transistor cells and to one or more second load electrodes of a subset of transistor cells of the second plurality of transistor cells, wherein the one or more second load electrodes are arranged at a side of the piezoresistive material bodies facing away from the piezoelectric material bodies.

23. The piezoresistive transistor device of claim 19, further comprising:

a housing structure having a first cavity receiving the first plurality of transistor cells and a second cavity receiving the second plurality of transistor cells, the cavities being disposed adjacent to each other with respect to a lateral dimension of the housing structure.

24. The piezoresistive transistor device of claim 23, wherein the first plurality of transistor cells is received in the first cavity with the piezoelectric material bodies and the piezoresistive material bodies oriented inclined or perpendicular to the lateral dimension of the housing and/or the second plurality of transistor cells is received in the second cavity with the piezoelectric material bodies and the piezoresistive material bodies being oriented inclined or perpendicular to the lateral dimension of the housing.

25. The piezoresistive transistor device of claim 19, wherein the piezoresistive transistor device is a power device.

26. The piezoresistive transistor device of claim 25, wherein the piezoresistive transistor device has a threshold voltage in a range between 1.2 V and 30 V.

27. A power electronic module, comprising:

the piezoresistive transistor device of claim 25;

a carrier on which the piezoresistive transistor device is mounted; and a heatsink attached to the carrier.

28. The power electronic module of claim 27, further comprising:

a temperature sensor mounted on the carrier.

29. A piezoresistive transistor device, comprising:

a first transistor cell comprising a piezoelectric material body and a first piezoresistive material body, wherein the piezoelectric material body and the first piezoresistive material body are arranged in a stacked configuration, wherein a first electrical resistance of the first piezoresistive material body is dependent upon a voltage applied across the piezoelectric material body by way of a pressure applied by the piezoelectric material body to the first piezoresistive material body; and a second transistor cell comprising the piezoelectric material body and a second piezoresistive material body, wherein the piezoelectric material body and the second piezoresistive material body are arranged in a stacked configuration, wherein a second electrical resistance of the second piezoresistive material body is dependent upon the voltage applied across the piezoelectric material body by way of a pressure applied by the piezoelectric material body to the second piezoresistive material body, wherein the first piezoresistive material body and the second piezoresistive material body are oriented in different spatial planes which are not parallel to each other.

30. The piezoresistive transistor device of claim 29, further comprising:

a control terminal of the piezoresistive transistor device which is connected to a control electrode, the control electrode being connected to the piezoelectric material body;

a first terminal of the piezoresistive transistor device, the first terminal being connected to a first electrode of the first transistor cell which is arranged between the piezoelectric material body and the first piezoresistive material body and to a second electrode of the second transistor cell which is arranged between the piezoelectric material body and the second piezoresistive material body;

a second terminal of the piezoresistive transistor device, the second terminal being connected to a second electrode of the first transistor cell, the second electrode of the first transistor cell is arranged on the first piezoresistive material body; and a third terminal of the piezoresistive transistor device, the third terminal being connected to a second electrode of the second transistor cell, the second electrode of the second transistor cell is arranged on the second piezoresistive material body.

31. The piezoresistive transistor device of claim 29, further comprising a third transistor cell comprising:

the piezoelectric material body; and a third piezoresistive material body, wherein the piezoelectric material body and the third piezoresistive material body are arranged in a stacked configuration, wherein a third electrical resistance of the third piezoresistive material body is dependent upon the voltage applied across the piezoelectric material body by way of a pressure applied by the piezoelectric material body
to the third piezoresistive material body,
wherein the third piezoresistive material body is oriented
in a spatial plane which is not parallel to any of the
spatial planes in which the first piezoresistive material
body and the second piezoresistive material body are
oriented.

\*    \*    \*    \*    \*